United States Patent
Yang et al.

(10) Patent No.: US 12,035,594 B2
(45) Date of Patent: *Jul. 9, 2024

(54) DISPLAY SUBSTRATE HAVING ADDITIONAL PAD LAYER

(71) Applicants: Chengdu BOE Optoelectronics Technology Co., Ltd., Chengdu (CN); BOE Technology Group Co., Ltd., Beijing (CN)

(72) Inventors: Huijuan Yang, Beijing (CN); Tingliang Liu, Beijing (CN); Tinghua Shang, Beijing (CN); Dan Cao, Beijing (CN); Yu Wang, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/166,087

(22) Filed: Feb. 8, 2023

(65) Prior Publication Data

US 2023/0189595 A1 Jun. 15, 2023

Related U.S. Application Data

(63) Continuation of application No. 16/825,089, filed on Mar. 20, 2020, now Pat. No. 11,581,385.

(30) Foreign Application Priority Data

Mar. 28, 2019 (CN) .......................... 201910244901.8
Nov. 22, 2019 (CN) .......................... 201911162376.1

(51) Int. Cl.
*H10K 59/131* (2023.01)
*G09G 3/3225* (2016.01)
(Continued)

(52) U.S. Cl.
CPC ......... *H10K 59/131* (2023.02); *G09G 3/3225* (2013.01); *G09G 3/3266* (2013.01);
(Continued)

(58) Field of Classification Search
CPC ............... H10K 59/131; H10K 59/122; H10K 59/1213; H10K 59/352; H10K 59/1216;
(Continued)

(56) References Cited

U.S. PATENT DOCUMENTS 9,035,854 B2 5/2015 Lee et al.
9,673,266 B2 6/2017 Zhang
(Continued)

FOREIGN PATENT DOCUMENTS

CN 102456707 A 5/2012
CN 102569675 A 7/2012
(Continued)

OTHER PUBLICATIONS

Non-Final Rejection for U.S. Appl. No. 18/083,969, issued on Apr. 13, 2023.
(Continued)

*Primary Examiner* — Eric W Jones
(74) *Attorney, Agent, or Firm* — Westman, Champlin & Koehler, P.A.

(57) ABSTRACT

A display substrate and a pixel driving circuit, the display substrate includes: a base substrate; a first conductive layer on the base substrate, the first conductive layer including a first signal line, a second signal line, and an additional pad layer spaced apart from each other; and a first electrode on a side of the first conductive layer away from the base substrate, where an orthographic projection of the first electrode on the base substrate and an orthographic projection of the additional pad layer on the base substrate have a second overlapping region, and the first conductive layer (Continued)

further includes a first electrical connection portion, and an orthographic projection of the first electrical connection portion on the base substrate does not overlap an orthographic projection of the second overlapping region on the base substrate.

18 Claims, 8 Drawing Sheets

(51) Int. Cl.
    *G09G 3/3266*     (2016.01)
    *H01L 27/12*     (2006.01)
    *H10K 50/11*     (2023.01)
    *H10K 59/12*     (2023.01)
    *H10K 59/121*     (2023.01)
    *H10K 59/122*     (2023.01)
    *H10K 59/35*     (2023.01)
    *H10K 71/00*     (2023.01)

(52) U.S. Cl.
    CPC ......... *H10K 50/11* (2023.02); *H10K 59/1213* (2023.02); *H10K 59/1216* (2023.02); *H10K 59/122* (2023.02); *H10K 59/352* (2023.02); *H10K 71/00* (2023.02); *G09G 2300/0426* (2013.01); *H01L 27/124* (2013.01); *H01L 27/1255* (2013.01); *H10K 59/1201* (2023.02)

(58) Field of Classification Search
    CPC .... H10K 59/1201; H10K 71/00; H10K 50/11; G09G 3/3225; G09G 3/3266; G09G 2300/0426; H01L 27/124; H01L 27/1255
    USPC ...................................................... 257/40, 59
    See application file for complete search history.

(56) References Cited

U.S. PATENT DOCUMENTS

| | | | |
|---|---|---|---|
| 10,297,199 B2 | 5/2019 | Cai | |
| 10,541,294 B2 | 1/2020 | Hong et al. | |
| 10,580,850 B2 | 3/2020 | Lee et al. | |
| 10,591,753 B2 | 3/2020 | Kim et al. | |
| 10,644,091 B2 | 5/2020 | Liu et al. | |
| 10,985,235 B2 | 4/2021 | Lee et al. | |
| 11,563,073 B2 | 1/2023 | Li et al. | |
| 11,581,385 B2 * | 2/2023 | Yang | H10K 59/122 |
| 2012/0162053 A1 | 6/2012 | Lee et al. | |
| 2014/0048793 A1 | 2/2014 | Sako et al. | |
| 2016/0254333 A1 | 9/2016 | Zhang | |
| 2017/0124953 A1 | 5/2017 | Shim | |
| 2018/0062102 A1 | 3/2018 | Kim | |
| 2018/0082636 A1 | 3/2018 | Cai | |
| 2018/0158895 A1 | 6/2018 | Lee et al. | |
| 2018/0254304 A1 | 9/2018 | Hong et al. | |
| 2018/0337226 A1 | 11/2018 | Liu et al. | |
| 2018/0342570 A1 | 11/2018 | Hong et al. | |
| 2019/0064552 A1 | 2/2019 | Kim et al. | |
| 2020/0161411 A1 | 5/2020 | Lee et al. | |
| 2021/0233989 A1 | 7/2021 | Li et al. | |
| 2023/0120171 A1 | 4/2023 | Li et al. | |

FOREIGN PATENT DOCUMENTS

| | | |
|---|---|---|
| CN | 103493121 A | 1/2014 |
| CN | 103943787 A | 7/2014 |
| CN | 105702214 A | 6/2016 |
| CN | 107230452 A | 10/2017 |
| CN | 207116482 U | 3/2018 |
| CN | 108172594 A | 6/2018 |
| CN | 108493226 A | 9/2018 |
| CN | 109427854 A | 3/2019 |
| CN | 109786434 A | 5/2019 |
| EP | 2447997 A1 | 5/2012 |
| KR | 10-2007-0041240 A | 4/2007 |

OTHER PUBLICATIONS

USPTO-issued prosecution for U.S. Appl. No. 17/040,587, filed Sep. 23, 2020, including: Notice of Allowance and Fees Due (PTOL-85), mailed on Sep. 20, 2022, 8 pages; and Non-Final Rejection, mailed on Jun. 2, 2022, 15 pages; 23 pages total.
Non-Final Rejection for U.S. Appl. No. 16/825,089, issued on Jul. 7, 2021, 15 pages.
First Office Action, including Search Report, for Chinese Patent Application No. 201910244901.8, dated Jun. 15, 2020, 13 pages.
Second Office Action, including Search Report, for Chinese Patent Application No. 201910244901.8, dated Dec. 28, 2020, 14 pages.
Non-Final Rejection for U.S. Appl. No. 16/825,089, issued on Jul. 7, 2021.
Final Rejection for U.S. Appl. No. 16/825,089, issued on Dec. 2, 2021.
Notice of Allowance and Fees Due for U.S. Appl. No. 16/825,089, issued on Oct. 21, 2022.

* cited by examiner

DISPLAY SUBSTRATE HAVING ADDITIONAL PAD LAYER

CROSS-REFERENCE TO RELATED APPLICATION

The present disclosure is a continuation of application Ser. No. 16/825,089, filed on Mar. 20, 2020, now U.S. Pat. No. 11,581,385, which claims the benefit of Chinese Patent Application No. 201910244901.8, filed on Mar. 28, 2019 in the National Intellectual Property Administration of China and claims the benefit of Chinese Patent Application No. 201911162376.1, filed on Nov. 22, 2019 in the National Intellectual Property Administration of China, the whole disclosures of which are incorporated herein by reference in their entireties.

TECHNICAL FIELD

The present disclosure relates to the field of display technology, and in particular, to a display substrate, a method for manufacturing the same, and a pixel driving circuit.

BACKGROUND

OLED (Organic Light-Emitting Diode) is a device that generates electroluminescence using a multilayer organic thin film structure. It is a kind of electroluminescence device. It is easy to make and only requires a low driving voltage. These main features make OLED stand out in meeting the application in flat displays. OLED displays are thinner and lighter than LCDs and have high brightness, low power consumption, fast response, high definition, good flexibility, and high luminous efficiency, which may meet new demands of consumers for the display technology.

SUMMARY

Some embodiments of the present disclosure provide a display substrate comprising: a base substrate; a first conductive layer on the base substrate, the first conductive layer comprising a first signal line, a second signal line, and an additional pad layer which are spaced apart from each other; a pixel defining layer on a side of the first conductive layer away from the base substrate, the pixel defining layer having an opening; and an electroluminescent material layer in the opening, wherein the electroluminescent material layer comprises a first end portion and a second end portion opposite to each other, an orthographic projection of the first end portion on the base substrate falls within an orthographic projection of the first signal line on the base substrate, an orthographic projection of the second end portion on the base substrate falls within an orthographic projection of the additional pad layer on the base substrate, and the orthographic projection of the first end portion on the base substrate and the orthographic projection of the second end portion on the base substrate are respectively located on both sides of an orthographic projection of the second signal line on the base substrate.

In some embodiments, an orthographic projection of the electroluminescent material layer on the base substrate is an axisymmetric pattern which is symmetrical with respect to a center line of the orthographic projection of the second signal line on the base substrate, and the orthographic projection of the first end portion on the base substrate and the orthographic projection of the second end portion on the base substrate are symmetrical with respect to the center line of the orthographic projection of the second signal line on the base substrate.

In some embodiments, an orthographic projection of the first end portion on a first plane coincides with an orthographic projection of the second end portion on the first plane, wherein the first plane is perpendicular to the base substrate and parallel to an extending direction of the second signal line.

In some embodiments, the first signal line, the second signal line, and the additional pad layer are parallel to each other, and a distance between the first signal line and the second signal line is equal to a distance between the second signal line and the additional pad layer.

In some embodiments, the electroluminescent material layer further comprises a first portion adjacent to the first end portion and a second portion adjacent to the second end portion, an orthographic projection of the first portion on the base substrate is located between the orthographic projection of the first signal line on the base substrate and the orthographic projection of the second signal line on the base substrate, and an orthographic projection of the second portion on the base substrate is located between the orthographic projection of the second signal line on the base substrate and the orthographic projection of the additional pad layer on the base substrate.

In some embodiments, the orthographic projection of the first portion on the base substrate and the orthographic projection of the second portion on the base substrate are symmetrical with respect to the center line of the orthographic projection of the second signal line on the base substrate.

In some embodiments, an orthographic projection of the first portion on the first plane coincides with an orthographic projection of the second portion on the first plane.

In some embodiments, a thickness of the first end portion is equal to a thickness of the second end portion, a thickness of the first portion is equal to a thickness of the second portion.

In some embodiments, the electroluminescent material layer further comprises a third portion located between the first portion and the second portion, and an orthographic projection of the third portion on the base substrate falls within the orthographic projection of the second signal line on the base substrate.

In some embodiments, the third portion, the first end portion, and the second end portion have the same thickness.

In some embodiments, the display substrate further comprising: an insulating layer on the side of the first conductive layer away from the base substrate, the insulating layer filling an interval between the first signal line and the second signal line and an interval between the second signal line and the additional pad layer; and a first electrode on a side of the insulating layer away from the base substrate, wherein the electroluminescent material layer is disposed on a side of the first electrode away from the base substrate, and the orthographic projection of the electroluminescent material layer on the base substrate falls within an orthographic projection of the first electrode on the base substrate.

In some embodiments, a first recess and a second recess are provided on a side of the insulating layer away from the base substrate, and the first portion of the electroluminescent material layer is partially provided in the first recess and the second portion of the electroluminescent layer is partially provided in the second recess.

In some embodiments, the orthographic projection of the first electrode on the base substrate is an axisymmetric pattern which is symmetrical with respect to the center line of the orthographic projection of the second signal line on the base substrate, the orthographic projection of the first signal line on the base substrate and the orthographic projection of the first electrode on the base substrate have a first overlapping region, the orthographic projection of the additional pad layer on the base substrate and the orthographic projection of the first electrode on the base substrate have a second overlapping region, wherein the second overlapping region and at least a portion of the first overlapping region are symmetrical with respect to the center line of the orthographic projection of the second signal line on the base substrate.

In some embodiments, the first conductive layer further comprises a first electrical connection portion, an orthographic projection of the first electrical connection portion on the base substrate is not overlapped with the orthographic projection of the first electrode on the base substrate, and the additional pad layer is electrically connected to the first electrical connection portion.

In some embodiments, wherein the additional pad layer is in direct electrical contact with the first electrical connection portion.

In some embodiments, the orthographic projection of the additional pad layer on the base substrate falls within the orthographic projection of the first electrode on the base substrate, and the additional pad layer is electrically connected to the first electrical connection portion through a connection electrode.

In some embodiments, the first conductive layer further comprises a first signal terminal, an orthographic projection of the first signal terminal on the base substrate is not overlapped with the orthographic projection of the first electrode on the base substrate, and the additional pad layer is electrically connected to the first signal terminal.

In some embodiments, the first signal line is a driving voltage power line, the second signal line is a data line, and the electroluminescent material layer is an electroluminescent material layer of a red electroluminescent device in a display substrate.

Some embodiments of the present disclosure provide a pixel driving circuit, configured to drive a pixel in the display substrate according to the above embodiments, wherein the pixel driving circuit comprises a first transistor, a second transistor, a third transistor, a fourth transistor, a fifth transistor, a sixth transistor, a seventh transistor, and a capacitor, and the pixel comprises an electroluminescent device, wherein: a gate electrode of the first transistor is connected to a reset signal, a source electrode of the first transistor is connected to an initialization voltage, and a drain electrode of the first transistor is connected to a first node; a gate electrode of the second transistor is connected to a scanning signal, a source electrode of the second transistor is electrically connected to a second node, and a drain electrode of the second transistor is electrically connected to the first node; a gate electrode of the third transistor is electrically connected to the first node, a source electrode of the third transistor is electrically connected to a third node, and a drain electrode of the third transistor is electrically connected to the second node; a gate electrode of the fourth transistor is connected to the scanning signal, a source electrode of the fourth transistor is connected to a data signal, and a drain electrode of the fourth transistor is electrically connected to the third node; a gate electrode of the fifth transistor is connected to an emission control signal, a source electrode of the fifth transistor is connected to an ELVDD voltage, and a drain electrode of the fifth transistor is electrically connected to the third node; a gate electrode of the sixth transistor is connected to the emission control signal, a source electrode of the sixth transistor is electrically connected to the second node, and a drain electrode of the sixth transistor is electrically connected to a fourth node; a gate electrode of the seventh transistor is connected to the scanning signal, a source electrode of the seventh transistor is connected to the initialization voltage, and a drain electrode of the seventh transistor is electrically connected to the fourth node; a first capacitor plate of the capacitor is electrically connected to the first node, and a second capacitor plate of the capacitor is connected to the ELVDD voltage; a first electrode of the electroluminescent device is electrically connected to the fourth node, and a second electrode is connected to an ELVSS voltage, and the additional pad layer is electrically connected to the first node or the initialization voltage.

Some embodiments of the present disclosure provide a method for manufacturing a display substrate, comprising: forming a first conductive layer on a base substrate, wherein the first conductive layer comprises a first signal line, a second signal line, and an additional pad layer which are spaced apart from each other; and forming an electroluminescent material layer on the base substrate on which the first conductive layer is formed, wherein the electroluminescent material layer comprises a first end portion and a second end portion opposite to each other, an orthographic projection of the first end portion on the base substrate falls within an orthographic projection of the first signal line on the base substrate, an orthographic projection of the second end portion on the base substrate falls within an orthographic projection of the additional pad layer on the base substrate, and the orthographic projection of the first end portion on the base substrate and the orthographic projection of the second end portion on the base substrate are respectively located on both sides of an orthographic projection of the second signal line on the base substrate.

In some embodiments, before forming the electroluminescent material layer, the method further comprises:
forming an insulating layer on the base substrate on which the first conductive layer is formed; and
forming a first electrode on a side of the insulating layer away from the base substrate,
wherein the electroluminescent material layer is formed on a side of the first electrode away from the base substrate.

BRIEF DESCRIPTION OF THE DRAWINGS

In order to more clearly describe the technical solutions of the embodiments of the present disclosure, the drawings of the embodiments will be briefly described below. It should be understood that the drawings described below only relate to some embodiments of the present disclosure, but are not construed as the limitation of the present disclosure, wherein.

DETAILED DESCRIPTION OF THE EMBODIMENTS

Figure 1:
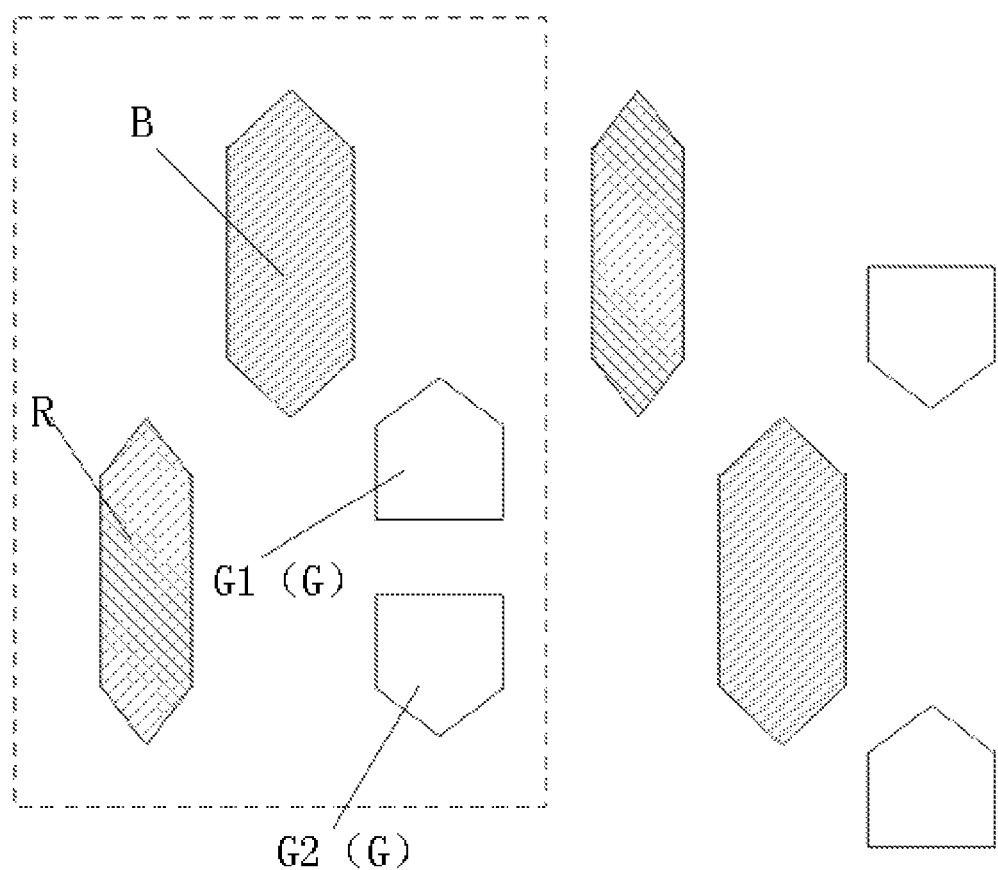
FIG. 1 is a schematic view of a pixel arrangement of an OLED display substrate according to some embodiments of the present disclosure.

In order to more clearly illustrate purposes, technical solutions, and advantages of the present disclosure, the embodiments of the present disclosure will be described in detail below with reference to the accompanying drawings. It should be understood that the following description of the embodiments is intended to explain the general idea of the present disclosure, and should not be construed as limiting the present disclosure. In the description and the drawings, the same or similar reference numerals refer to the same or similar parts or components. For clarity, the drawings are not necessarily drawn to scale, and some well-known components and structures may be omitted from the drawings.

Unless otherwise defined, the technical or scientific terms used in the present disclosure shall have the ordinary meanings understood by those having ordinary skills in the field to which the present disclosure belongs. The terms "first", "second", and the like used in the disclosure do not indicate any order, quantity, or importance, but are only used to distinguish different components. The word "a" or "an" does not exclude multiple. The word such as "including/include" or "comprising/comprise" means that the elements or items appearing before the word covers the elements or items appearing after the word and the equivalent thereof without excluding other elements or items. The word such as "connected" or "connected" is not limited to physical or mechanical connections, but may include electrical connections, whether direct or indirect. The word "Up", "down", "left", "right", "top", or "bottom" is only used to indicate the relative position relationship. When the absolute positions of the described objects change, the relative position relationship may also change correspondingly. When an element such as a layer, film, region, or substrate is referred to as being on or under another element, the element can be directly on or under the other element, or there may be intermediate elements.

Some embodiments of the present disclosure provide an electroluminescent display substrate, such as an OLED display substrate. The OLED display substrate in the embodiments includes a plurality of pixels, such as red pixels, blue pixels, and green pixels. FIG. 1 is a schematic view of a pixel arrangement of an OLED display substrate according to some embodiments of the present disclosure. As shown in FIG. 1, the pixels of the OLED display substrate in the embodiments are arranged in a GGRB manner, and the ratio of the number of red pixels to the number of blue pixels to the number of green pixels is 1:1:2. The dotted box in FIG. 1 shows a periodic unit of pixels, which includes a red pixel R, a blue pixel B, and two green pixels G, that is, a first green pixel G1 and a second green pixel G2. In the embodiments, the red pixel R and the blue pixel B are both hexagonal, and the first green pixel G1 and the second green pixel G2 are pentagons symmetrical to each other. The red pixel R, the blue pixel B, the first green pixel G1 and the second green pixel G2 are all axisymmetric patterns. In other embodiments, the red pixel R, the blue pixel B, the first green pixel G1 and the second green pixel G2 may also have other shapes.

Figure 2:
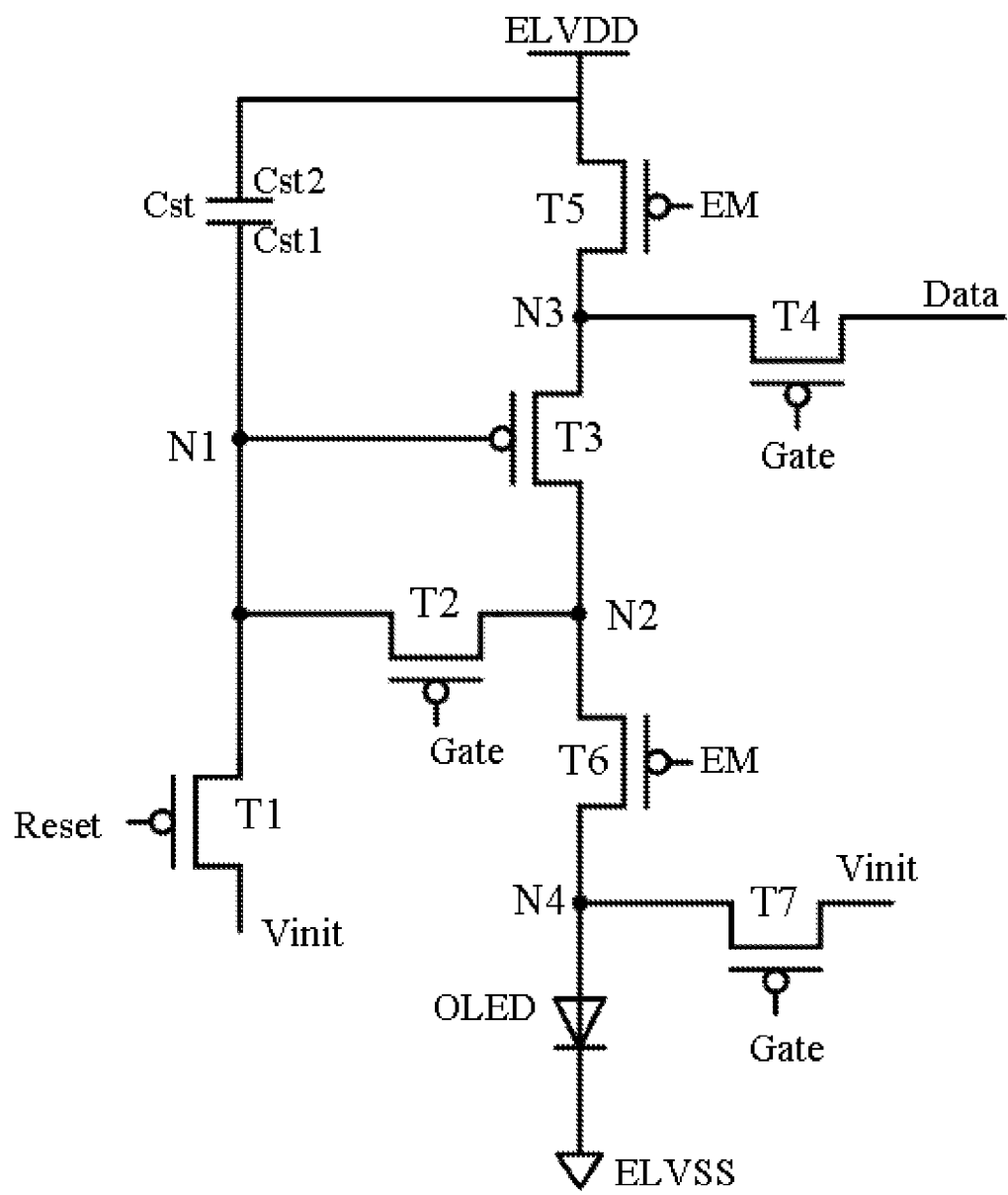
FIG. 2 is a circuit diagram of a driving circuit of a pixel of an OLED display substrate according to some embodiments of the present disclosure.

In the embodiments, each pixel has an organic light emitting device (such as an OLED) and a pixel driving circuit. FIG. 2 is a circuit diagram of a driving circuit of a pixel of an OLED display substrate according to some embodiments of the present disclosure. Referring to FIG. 2, the pixel driving circuit has a 7T1C structure, which includes seven transistors T1, T2, T3, T4, T5, T6, T7, and a capacitor Cst. Among them, the third transistor T3 is a driving transistor; ELVDD represents an ELVDD voltage provided from a power line; EM represents an emission control signal from an emission control line; Data represents a data signal from the data line; Gate represents a scanning signal from a gate line; Reset represents a reset signal provided from a previous gate line, Vinit represents a initialization voltage, and ELVSS represents an ELVSS voltage provided from another power line.

A gate electrode of the third transistor T3 is connected to a first capacitor plate Cst1 of the capacitor Cst. For example, the gate electrode of the third transistor T3 and the first capacitor plate Cst1 of the capacitor Cst are both electrically connected to a first node N1. A source electrode of the third transistor T3 is connected to the ELVDD power line through the fifth transistor T5. A drain electrode of the third transistor T3 is electrically connected to an organic light emitting device (such as an OLED) through the sixth transistor T6. For example, the drain electrode of the third transistor T3 and the sixth transistor T6 are electrically connected to a second node N2. The third transistor T3 receives the data signal Data according to a switching operation of the fourth transistor T4, and supplies a driving current Id to the organic light emitting device.

A gate electrode of the fourth transistor T4 is connected to a gate line, a source electrode of the fourth transistor T4 is connected to the data line, and a drain electrode of the fourth transistor T4 is connected to the source electrode of the third transistor T3 and is connected to the ELVDD power line through the fifth transistor T5. For example, the source electrode of the third transistor T3, the drain electrode of the fourth transistor T4, and a drain electrode of the fifth transistor T5 are all electrically connected to a third node N3.

A gate electrode of the second transistor T2 is connected to the gate line, the source electrode of the second transistor T2 is connected to the drain electrode of the third transistor T3 and is connected to the organic light emitting device through the sixth transistor T6, and the drain electrode of the second transistor T2 is connected to all of the first capacitor plate Cst1 of the capacitor Cst, a drain electrode of the first transistor T1, and the gate electrode of the third transistor T3. For example, the drain electrode of the second transistor T2, the first capacitor plate Cst1 of the capacitor Cst, the drain electrode of the first transistor T1, and the gate electrode of the third transistor T3 are all electrically connected to the first node N1. The second transistor T2 is turned on according to the scanning signal Gate from the gate line to electrically connect the gate electrode and the drain electrode of the third transistor T3.

A gate electrode of the first transistor T1 receives the reset signal Reset, the source electrode of the first transistor T1 receives the initialization voltage Vinit, and the drain electrode of the first transistor T1 is connected to the first node N1. The first transistor T1 is turned on according to the reset signal Reset to transfer the initialization voltage Vinit to the gate electrode of the third transistor T3.

A gate electrode of the fifth transistor T5 receives the emission control signal EM, the source electrode of the fifth transistor T5 is connected to the ELVDD power line, and the drain is connected to the third node N3.

A gate electrode of the sixth transistor T6 receives the emission control signal EM, the source electrode of the sixth transistor T6 is connected to the second node N2, and the drain electrode of the sixth transistor T6 is connected to a source electrode of the seventh transistor T7 and the organic light emitting device. For example, the drain electrode of the sixth transistor T6, the source electrode of the seventh transistor T7, and the organic light emitting device are all electrically connected to a fourth node N4. The transistors T5 and T6 are turned on simultaneously according to the emission control signal EM.

The gate electrode of the seventh transistor T7 is connected to the gate line to receive the scan signal Gate, the source electrode of the seventh transistor T7 is connected to the fourth node N4, and a drain electrode of the seventh transistor T7 receives the initialization voltage Vinit.

The capacitor Cst further includes a second capacitor plate Cst2 connected to the ELVDD power line, and a first electrode (for example, an anode) of the organic light emitting device is connected to the fourth node N4, and a second electrode (for example, a cathode) is connected to the ELVSS power line. Therefore, the organic light emitting device of the pixel may emit light based on the driving current from the third transistor T3.

Figure 3:
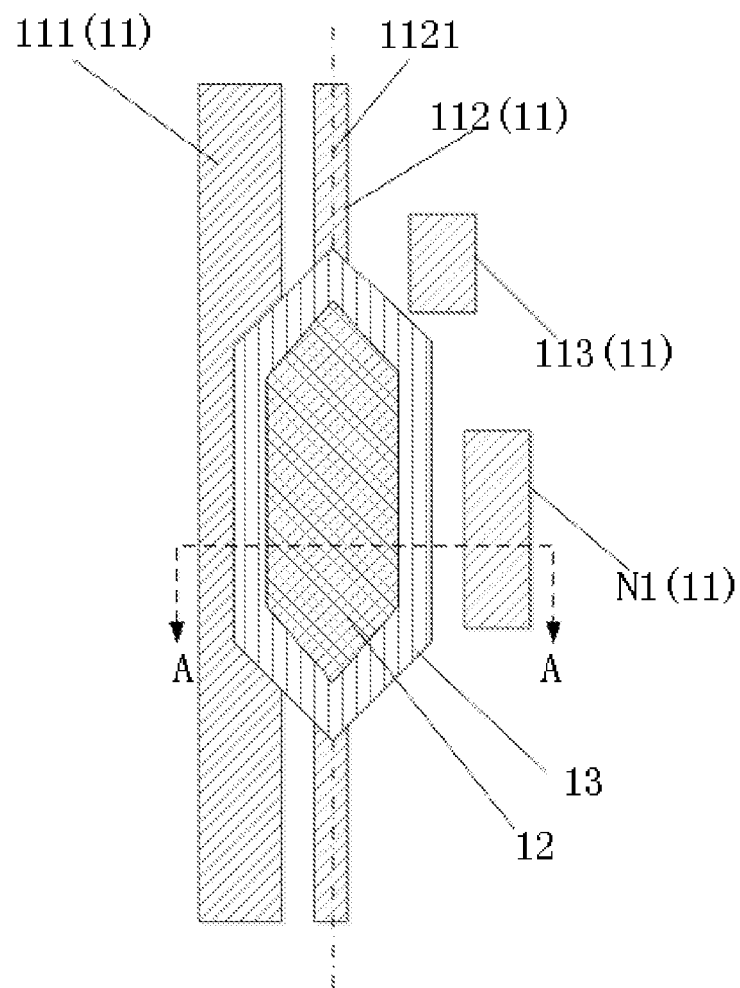
FIG. 3 is a schematic plan view of a red pixel region of an OLED display substrate according to some embodiments of the present disclosure.
Figure 4:
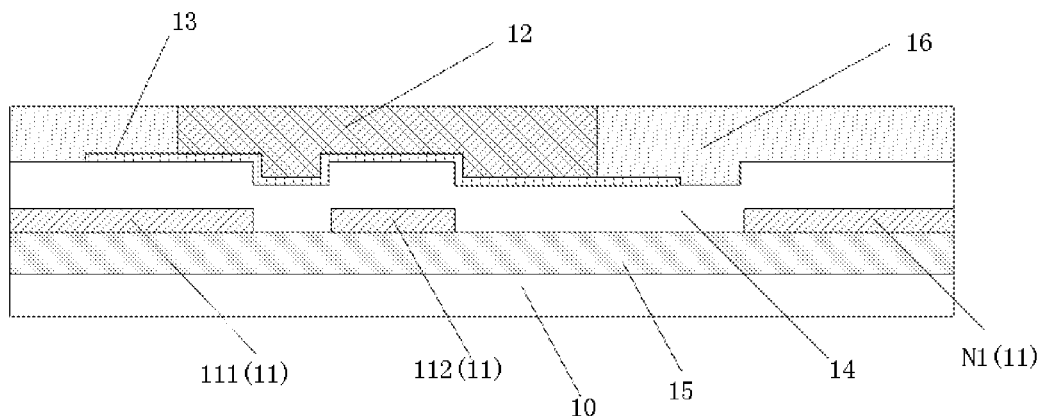
FIG. 4 is a schematic cross-sectional structural view of the red pixel region taken along line A-A in FIG. 3.

FIG. 3 illustrates a schematic plan view of a red pixel region of an OLED display substrate according to some embodiments of the present disclosure. FIG. 4 illustrates a schematic cross-sectional structure of the red pixel region taken along line A-A in FIG. 3. As shown in FIGS. 3 and 4, the red pixel region includes a base substrate 10 and a first conductive layer 11 provided on the base substrate 10. The first conductive layer 11 includes a first signal line 111, second signal line 112, a first electrical connection portion N1, and a first signal terminal 113 which are spaced apart from each other. The first signal line 111 is for example, a driving voltage power line (i.e., a ELVDD power line). The second signal line 112 is, for example, a data line. The first electrical connection portion N1 is, for example, a first node. The first signal terminal 113 is, for example, an initialization voltage terminal. A insulating layer 14 covers the first conductive layer 11. Since the components in the first conductive layer 11 are spaced apart from each other, a surface of the insulating layer 14 away from the base substrate 10 is not flat, and appears to be uneven. A first electrode 13 of the red pixel, such as an anode, is provided on a side of the insulating layer 14 away from the base substrate 10 and conforms to a surface shape of the side of the insulating layer 14 away from the base substrate 10. An electroluminescent material layer 12 of the red pixel, such as an organic luminescent material layer, is disposed on a side of the first electrode 13 away from the base substrate 10. The electroluminescent material layer 12 may be formed in a groove surrounded by a pixel defining layer 16. The groove is also referred to as an opening of the pixel defining layer 16. In order to clearly show the position relationship of each component in FIG. 3, the base substrate 10, the insulating layer 14 and the pixel defining layer 16 are omitted.

As shown in FIG. 3 and FIG. 4, orthographic projections of the first electrode 13 and the electroluminescent material layer 12 of the red pixel on the base substrate 10 are axisymmetric patterns which are symmetrical with respect to a center line of an orthographic projection of the second signal line 112 on the base substrate 10, and are both hexagons. The orthographic projection of the electroluminescent material layer 12 of the red pixel on the base substrate 10 falls within the orthographic projection of the first electrode 13 of the red pixel on the base substrate 10. Both of the orthographic projection of the first electrode 13 of the red pixel on the base substrate 10 and the orthographic projection of the electroluminescent material layer 12 of the red pixel on the base substrate 10 are overlapped with an orthographic projection of the first signal line 111 on the base substrate 10, and both of the orthographic projection of the first electrode 13 of the red pixel on the base substrate 10 and the orthographic projection of the electroluminescent material layer 12 of the red pixel on the base substrate 10 are overlapped with an orthographic projection of the second signal line 112 on the base substrate 10. Neither the orthographic projection of the first electrode 13 of the red pixel on the base substrate 10 nor the orthographic projection of the electroluminescent material layer 12 of the red pixel on the base substrate 10 is overlapped with an orthographic projection of the first node N1 on the base substrate 10, and Neither the orthographic projection of the first electrode 13 of the red pixel on the base substrate 10 nor the orthographic projection of the electroluminescent material layer 12 of the red pixel on the base substrate 10 is overlapped with an orthographic projection of the first signal terminal 113 on the base substrate 10.

The inventor finds that the red pixel of the OLED display substrate in FIG. 3 and FIG. 4 has a chromatic aberration. The inventor believes that this chromatic aberration is caused by follows: as shown in FIGS. 3 and 4, a left edge region of the electroluminescent material layer 12 of the red pixel is overlapped with the first conductive layer 11 (the first signal line 111), and a right edge region of the electroluminescent material layer 12 of the red pixel is not overlapped with the first conductive layer 11. As a result, the left edge region of the electroluminescent material layer 12 and the right edge region of the electroluminescent material layer 12 are located at different heights, that is, a distance between the left edge region of the electroluminescent material layer 12 and the base substrate 10 is different from a distance between the right edge region of the electroluminescent material layer 12 and the base substrate 10, thereby causing the chromatic aberration when the red pixel emits light.

In order to overcome the above problems, some embodiments of the present disclosure provide a display substrate, the display substrate includes: a base substrate; a first conductive layer disposed on the base substrate, wherein the first conductive layer includes a first signal line, a second signal line, and an additional pad layer which are spaced apart from each other; and an electroluminescent material layer disposed on a side of the first conductive layer away from the base substrate. The electroluminescent material layer includes a first end portion and a second end portion opposite to each other. An orthographic projection of the first end portion on the base substrate falls within an orthographic projection of the first signal line on the base substrate. An orthographic projection of the second end portion on the base substrate falls within an orthographic projection of the additional pad layer on the base substrate. The orthographic projection of the first end portion on the base substrate and the orthographic projection of the second end portion on the base substrate are respectively located on both sides of an orthographic projection of the second signal line on the base substrate. In the present disclosure, by providing the additional pad layer disposed on the same layer as the first signal line, the additional pad layer raises a right edge region of a pixel, such as a red pixel, so that a left edge region and the right edge region of the pixel are basically symmetrical in structure. In this case, the left edge region and the right edge region of the electroluminescent material layer of the red pixel have the same thickness and are located at the same height. As a result, light emission in the left edge region of the red pixel is basically the same as that in the right edge region of the red pixel, thereby reducing the chromatic aberration.

Figure 5:
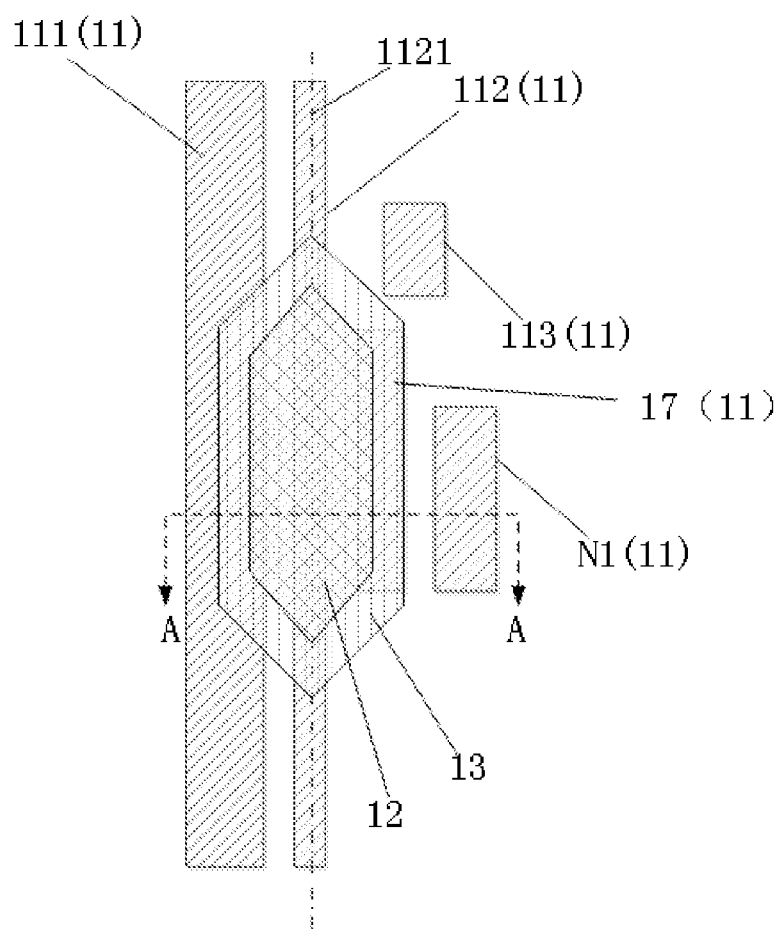
FIG. 5 is a schematic plan view of a red pixel region of an OLED display substrate according to some embodiments of the present disclosure.
Figure 6:
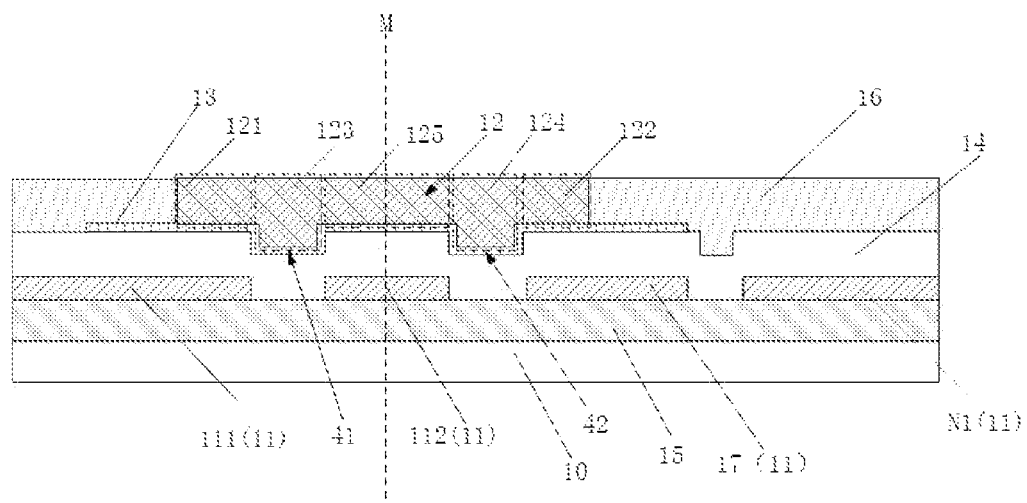
FIG. 6 is a schematic cross-sectional structural view of the red pixel region taken along line A-A in FIG. 5.

FIG. 5 illustrates a schematic plan view of a red pixel region of an OLED display substrate according to some embodiments of the present disclosure. FIG. 6 illustrates a schematic cross-sectional structure of the red pixel region taken along line A-A in FIG. 5. As shown in FIGS. 5 and 6, the red pixel region includes a base substrate 10 and a first conductive layer 11 provided on the base substrate 10. The first conductive layer 11 includes a first signal line 111 (such as a ELVDD power line, in the following embodiments, the first signal line is described by taking the ELVDD power line as an example, so it may also be referred to as the ELVDD power line 111 hereafter), a second signal line 112 (such as a data line, in the following embodiments, the second signal line is described by taking the data line as an example, so it may also be referred to as the data line 112 hereafter), a first electrical connection portion N1 (such as a first node, in the following embodiments, the first electrical connection portion is described by taking the first node as an example, so it may also be referred to as the first node N1 hereafter), and a first signal terminal 113 (such as a initialization voltage terminal, in the following embodiments, the first signal terminal is described by taking the initialization voltage terminal as an example, so it may also be referred to as the initialization voltage terminal 113 hereafter). The first signal line 111, the second signal line 112, the first electrical connection portion N1, and the first signal terminal 113 are spaced apart from each other. In addition, the first conductive layer 11 further includes an additional pad layer 17, which may be disposed on the same layer as the first signal line 111, the second signal line 112, the first electrical connection portion N1, and the first signal terminal 113, for example, they are formed of the same material by using the same patterning process. The first conductive layer 11 is usually disposed on a flat surface, thus, a surface of the first signal line 111 close to the base substrate 10, a surface of the second signal line 112 close to the base substrate 10, a surface of the first electrical connection portion N1 close to the base substrate 10, a surface of the first signal terminal 113 close to the base substrate 10, a surface of the additional pad layer 17 close to the base substrate 10 are at the same distance from the base substrate 10. The first signal line 111, the second signal line 112, the first electrical connection portion N1, the first signal terminal 113, and the additional pad layer 17 have the same thickness.

In some embodiments, the red pixel region further includes other layer structures 15 disposed between the base substrate 10 and the first conductive layer 11, such as a gate layer, an active layer, a planarization layer, and the like. A surface of the other layer structures 15 in contact with the first conductive layer 11 is generally flat to facilitate the formation of the first conductive layer 11.

As shown in FIGS. 5 and 6, the insulating layer 14 covers the first conductive layer 11. The first electrode 13 of the red pixel (such as an anode, in the following embodiments, the first electrode is described by taking the anode as an example, so it may also be referred to as the anode 13 hereafter) is disposed on a side of the insulating layer 14 away from the base substrate 10 and conforms to the surface shape of the side of the insulating layer 14 away from the base substrate 10. An electroluminescent material layer 12 of the red pixel, for example, an organic luminescent material layer, is disposed on a side of the first electrode 13 away from the base substrate 10. The electroluminescent material layer 12 may be formed in a groove surrounded by a pixel defining layer 16, and may include a hole injection layer, a hole transport layer, a light emitting layer, an electron transport layer, and an electron injection layer which are stacked on each other and sequentially arranged away from the base substrate. In order to clearly show the positional relationship of each component in FIG. 5, the base substrate 10, the insulating layer 14 and the pixel defining layer 16 are omitted.

As shown in FIGS. 5 and 6, the electroluminescent material layer 12 includes a first end portion 121 and a second end portion 122 opposite to each other, which are respectively located at a left end and a right end of the electroluminescent material layer 12. An orthographic projection of the first end portion 121 on the base substrate 10 falls within an orthographic projection of the ELVDD power line 111 on the base substrate 10. That is, the orthographic projection of the electroluminescent material layer 12 on the base substrate 10 and the orthographic projection of the ELVDD power line 111 on the base substrate 10 have an overlapping region, and the orthographic projection of the first end portion 121 on the base substrate 10 falls within or coincides with the overlapping region. An orthographic projection of the second end portion 122 on the base substrate 10 falls within an orthographic projection of the additional pad layer 17 on the base substrate 10. That is, the orthographic projection of the electroluminescent material layer 12 on the base substrate 10 and the orthographic projection of the additional pad layer 17 on the base substrate 10 have an overlapping region, and the orthographic projection of the second end portion 122 on the base substrate 10 falls within or coincides with the overlapping region. By providing the additional pad layer disposed on the same layer as the first signal line, the additional pad layer raises the right edge region of the red pixel, so as to compensate for the chromatic aberration which is caused by the left edge region and the right edge region of the electroluminescent material layer 12 being located at different heights in the embodiments shown in FIGS. 3 and 4.

In some embodiments, referring to FIGS. 5 and 6, the orthographic projection of the electroluminescent material layer 12 on the base substrate 10 is an axisymmetric pattern, a symmetry axis of which is a center line of an orthographic projection of the data line 112 on the base substrate 10. The axisymmetric pattern is, for example, a hexagon. In the present disclosure, the orthographic projection of the data line 112 on the base substrate 10 is elongated, and the center line of the orthographic projection of the data line 112 on the base substrate 10 extends in a direction in which the data line 112 extends. The orthographic projection of the first end portion 121 of the electroluminescent material layer 12 on the base substrate 10 and the orthographic projection of the second end portion 122 of the electroluminescent material layer 12 on the base substrate 10 are symmetrical with respect to with respect to the center line of the orthographic projection of the data line 112 on the base substrate 10. The shape and area of the orthographic projection of the first end portion 121 on the base substrate 10 are substantially the same as the shape and area of the orthographic projection of the second end portion 121 on the base substrate 10, respectively. Therefore, the area and shape of the right edge region of the electroluminescent material layer 12 of the red pixel raised by the additional pad layer is substantially the same as the area and shape of the left edge region of the electroluminescent material layer 12 of the red pixel raised by the ELVDD power line 111, which is beneficial to reduce the chromatic aberration at the edges.

In some embodiments, referring to FIGS. 5 and 6, an orthographic projection of the first end portion 121 on a first plane M coincides with an orthographic projection of the second end portion 122 on the first plane M, wherein the first plane M may be perpendicular to the base substrate 10 and parallel to the extending direction of the data line 112. The first plane M may include the center line of the orthographic projection of the data line 112 on the base substrate 10, that is, the center line of the orthographic projection of the data line 112 on the base substrate 10 may lie on the first plane M. A distance between a surface of the first end portion 121 of the electroluminescent material layer 12 of the red pixel facing the base substrate 10 and the base substrate 10 is substantially equal to a distance between a surface of the second end portion 122 of the electroluminescent material layer 12 of the red pixel facing the base substrate 10 and the base substrate 10, and the first end portion 121 and the second end portion 122 have the same thickness. It can be understood that the first end portion 121 and the second end portion 122 are at the same height and have the same thickness. The first end portion 121 and the second end portion 122 of the electroluminescent material layer 12 are substantially symmetrical with respect to the first plane M. In this case, the right edge region of the electroluminescent material layer 12 of the red pixel which is raised by the additional pad layer, and the left edge region of the electroluminescent material layer 12 of the red pixel which is raised by the ELVDD power line 111 are at the same height and have the same thickness, which is beneficial to reducing the chromatic aberration at the edges.

In some embodiments, as shown in FIGS. 5 and 6, the additional pad layer 17 is spaced apart from either of the ELVDD power line 111, the data line 112, the first node N1, and the first signal terminal 113. Specifically, the ELVDD power line 111, the data line 112, and the additional pad layer 17 are arranged parallel to each other and are arranged at equal intervals in sequence, that is, a distance between the ELVDD power line 111 and the data line 112 is equal to a distance between the data line 112 and the additional pad layer 17.

In some embodiments, as shown in FIGS. 5 and 6, since the first conductive layer 11 is generally disposed on a flat surface, and there is an interval between the ELVDD power line 111 and the data line 112 of the first conductive layer 11, and there is an interval between the data line 112 and the additional pad layer 17 of the first conductive layer 11, the surface of the subsequently formed insulating layer 14, which covers the first conductive layer 11, away from the base substrate 10 is not flat. A first recess 141 and a second recess 142 are provided on a side of the insulating layer 14 away from the base substrate 10. An orthographic projection of the first recess 141 on the base substrate 10 is located between the orthographic projection of the ELVDD power line 111 on the base substrate 10 and the orthographic projection of the data line 112 on the base substrate 10. An orthographic projection of the second recess 142 on the base substrate 10 is located between the orthographic projection of the additional pad layer 17 on the base substrate 10 and the orthographic projection of the data line 112 on the base substrate 10. The anode 13 provided on the side of the insulating layer 14 away from the base substrate 10 conforms to the surface shape of the side of the insulating layer 14 away from the base substrate 10.

In some embodiments, as shown in FIGS. 5 and 6, the electroluminescent material layer 12 further includes a first portion 123 adjacent to the first end portion 121 and a second portion 124 adjacent to the second end portion 122. The first portion 123 of the electroluminescent material layer 12 is partially located in the first recess 141, and the second portion 124 is partially located in the second recess 142. An orthographic projection of the first portion 123 on the base substrate 10 is located between the orthographic projection of the ELVDD power line 111 on the base substrate 10 and the orthographic projection of the data line 112 on the base substrate 10. That is, the orthographic projection of the first portion 123 on the base substrate 10 is not overlapped with either of the orthographic projection of the ELVDD power line 111 on the base substrate 10 and the orthographic projection of the data line 112 on the base substrate 10. An orthographic projection of the second portion 124 on the base substrate 10 is located between the orthographic projection of the additional pad layer 17 on the base substrate 10 and the orthographic projection of the data line 112 on the base substrate 10. That is, the orthographic projection of the second portion 124 on the base substrate 10 is not overlapped with either of the orthographic projection of the additional pad layer 17 on the base substrate 10 and the orthographic projection of the data line 112 on the base substrate 10.

With continued reference to FIGS. 5 and 6, the orthographic projection of the first portion 123 on the base substrate 10 and the orthographic projection of the second portion 124 on the base substrate 10 are basically symmetrical with respect to the center line of the orthographic projection of the data line 10 on the base substrate 10. The orthographic projection of the first portion 123 on the first plane M coincides with the orthographic projection of the second portion 124 on the first plane M, that is, the first portion 123 and the second portion 124 of the electroluminescent material layer 12 are substantially symmetrical with respect to the first plane M. A distance between a surface of the first portion 123 of the electroluminescent material layer 12 facing the base substrate 10 and the base substrate 10 is substantially equal to a distance between a surface of the second portion 122 facing the base substrate 10 and the base substrate 10, and the first portion 123 and the second portion 124 have the same thickness. It can be understood that the first portion 123 and the second portion 124 are at the same height and have the same thickness.

With continued reference to FIGS. 5 and 6, the electroluminescent material layer 12 further includes a third portion 125 located between the first portion 123 and the second portion 124. An orthographic projection of the third portion 125 on the base substrate 10 is located within the orthographic projection of the data line 112 on the base substrate 10. The thickness of the third portion 125 is substantially the same as the thickness of either of the first end portion 121 and the second end portion 122. Therefore, the electroluminescent material layer 12 is substantially symmetrical with respect to the first plane M as a whole, so that light emission in the left region of the red pixel is substantially the same as that in the right region of the red pixel, thereby reducing the chromatic aberration.

In some embodiments, as shown in FIGS. 5 and 6, the orthographic projection of the anode 13 of the red pixel on the base substrate 10 is an axisymmetric pattern which is symmetrical with respect to the center line of the orthographic projection of the data line 112 on the base substrate 10. The axisymmetric pattern is for example, a hexagon. There is a first overlapping region in which the orthographic projection of the ELVDD power line 111 on the base substrate 10 is overlapped with the orthographic projection of the anode 13 on the base substrate 10, and there is a second overlapping region in which the orthographic projection of the additional pad layer 17 on the base substrate 10 is overlapped with the orthographic projection of the anode 13 on the base substrate 10. The second overlapping region and at least a portion of first overlapping region are symmetrical with respect to the center line of the orthographic projection of the data line 112 on the base substrate 10. The orthographic projection of the first end portion 121 of the electroluminescent material layer 12 of the red pixel on the base substrate 10 falls within the first overlapping region, and the orthographic projection of the second end portion 122 of the electroluminescent material layer 12 of the red pixel on the base substrate 10 falls within the second overlapping region. Therefore, at both the left and right end portions of the red pixel, the effect of the voltage applied by the anode 13 on the first end portion 121 of the electroluminescent material layer 12 is substantially the same as that on the second end portion 122 of the electroluminescent material layer 12, so that luminous effects at both the left end portion and the right portion of the red pixel are basically the same, and the chromatic aberration is reduced.

In some embodiments, as shown in FIGS. 5 and 6, the orthographic projection of the additional pad layer 17 on the base substrate 10 falls within the orthographic projection of the anode 13 on the base substrate 10, and the orthographic projection of the first node N1 on the base substrate 10 is not overlapped with the orthographic projection of the anode 13 on the base substrate 10. The orthographic projection of the first signal terminal 113 on the base substrate 10 is not overlapped with the orthographic projection of the anode 13 on the base substrate 10. In this case, the additional pad layer 17, the first node N1 and the first signal terminal 113 are insulated from each other.

Figure 7:
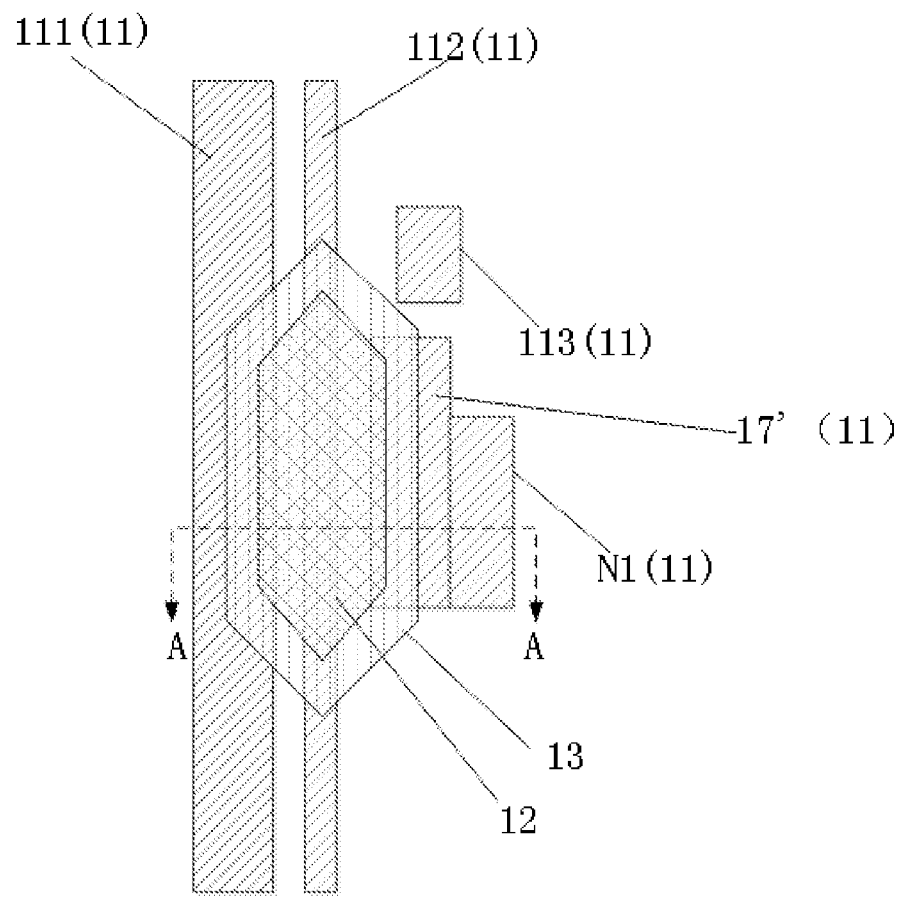
FIG. 7 is a schematic plan view of a red pixel region of an OLED display substrate according to some embodiments of the present disclosure.
Figure 8:
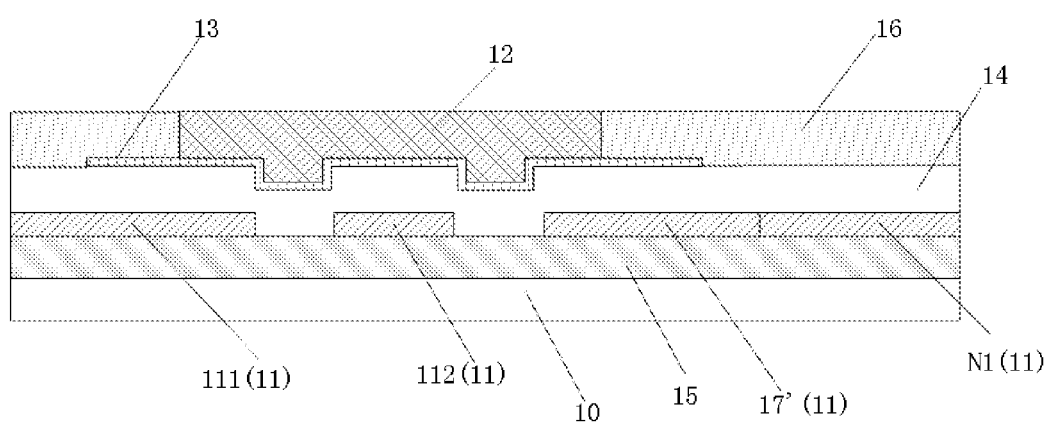
FIG. 8 is a schematic cross-sectional structural view of the red pixel region taken along line A-A in FIG. 7.

FIG. 7 illustrates a schematic plan view of a red pixel region of an OLED display substrate according to some embodiments of the present disclosure. FIG. 8 shows a schematic cross-sectional structure of the red pixel region taken along line A-A in FIG. 7. In the embodiments, the structure of the red pixel region of the OLED display substrate is substantially the same as the structure of the red pixel region of the OLED display substrate in the embodiments corresponding to FIGS. 5 and 6. The following mainly introduces differences between the two structures.

As shown in FIGS. 7 and 8, the additional pad layer 17' is directly electrically connected to the first node N1. Although the boundary between the additional pad layer 17' and the first node N1 is shown in FIGS. 7 and 8, those skilled in the art may understand that the additional pad layer 17' is integrated with the first node N1, and the additional pad layer 17' may be considered to extend from the first node N1 toward the data line 112. In the embodiments, the orthographic projection of the additional pad layer 17' on the base substrate 10 does not fall within the orthographic projection of the anode 13 on the base substrate 10, but is partly overlapped with the orthographic projection of the anode 13 on the base substrate 10. The process of the structure in which the additional pad layer 17' is directly electrically connected to the first node N1 is simple, and the OLED display substrate with the structure is easy to manufacture. Since the additional pad layer 17' is directly electrically connected to the first node N1, it is possible to prevent the additional pad layer 17' from forming an island and accumulating electrostatic charges, thereby preventing adverse effects on the display substrate.

Figure 9:
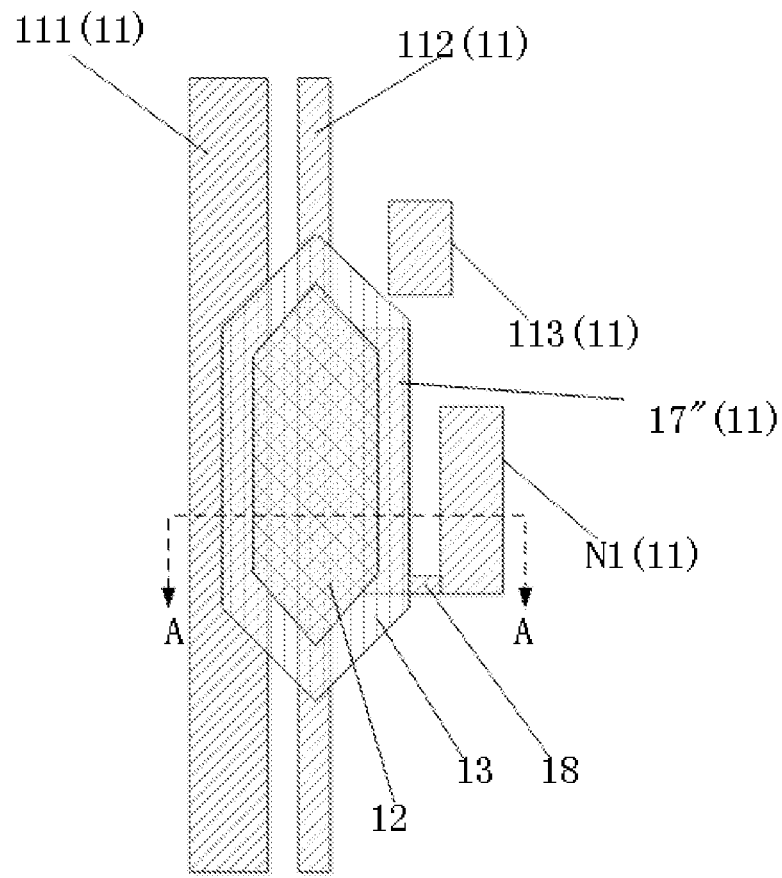
FIG. 9 is a schematic plan view of a red pixel region of an OLED display substrate according to some embodiments of the present disclosure.
Figure 10:
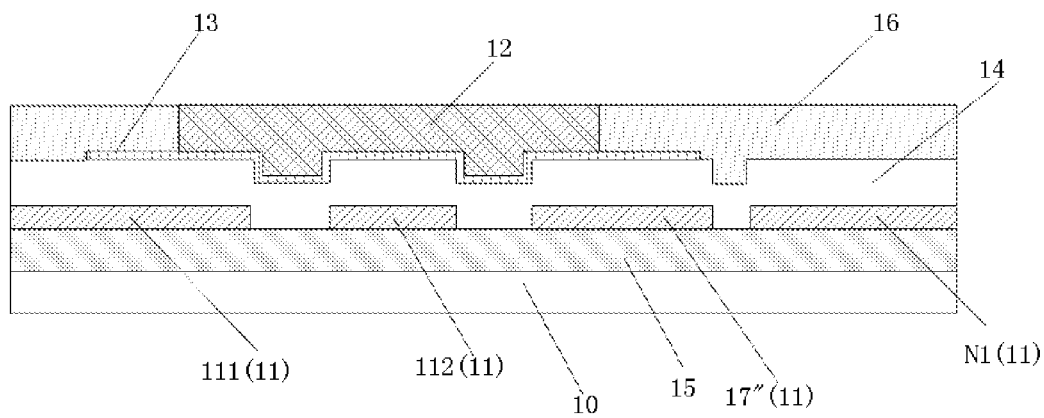
FIG. 10 is a schematic cross-sectional structural view of the red pixel region taken along line A-A in FIG. 9.

FIG. 9 illustrates a schematic plan view of a red pixel region of an OLED display substrate according to some embodiments of the present disclosure. FIG. 10 illustrates a schematic cross-sectional structure of the red pixel region taken along line A-A in FIG. 9. In the embodiments, the structure of the red pixel region of the OLED display substrate is substantially the same as the structure of the red pixel region of the OLED display substrate in the embodiments corresponding to FIG. 5 and FIG. 6. The following mainly introduces differences between the two structures.

As shown in FIGS. 9 and 10, the additional pad layer 17" is electrically connected to the first node N1 through a connection electrode 18. For example, an end of the connection electrode 18 may be electrically connected to an end of the first node N1, such as the lower end of the first node N1 as shown in FIG. 10, and the other end of the connection electrode 18 may be electrically connected to an end of the additional pad layer 17", such as, the lower end of the additional pad layer 17" as shown in FIG. 10. In other embodiments, the connection electrode 18 may also be electrically connected to other regions of the first node N1, and may also be electrically connected to other regions of the additional pad layer 17".

In some embodiments, the connection electrode 18 may be formed in the same layer with the same material as the additional pad layer 17" and the first node N1, that is, the connection electrode 18 may also be a part of the first conductive layer 11. This arrangement allows the connection electrode 18 to be formed using the same patterning process as the additional pad layer 17" and the first node N1. For example, the connection electrode 18 may be formed integrally with the additional pad layer 17" and the first node N1, thereby reducing manufacturing costs. In some embodiment, the connection electrode 18 may be located in a different layer from the additional pad layer 17" and the first node N1, as long as the connection electrode 18 may ensure that there is an electrical connection between the additional pad layer 17" and the first node N1. The additional pad layer 17" is electrically connected to the first node N1, which may prevent the additional pad layer 17" from forming an island and accumulating electrostatic charges, thereby preventing adverse effects on the display substrate.

Figure 11:
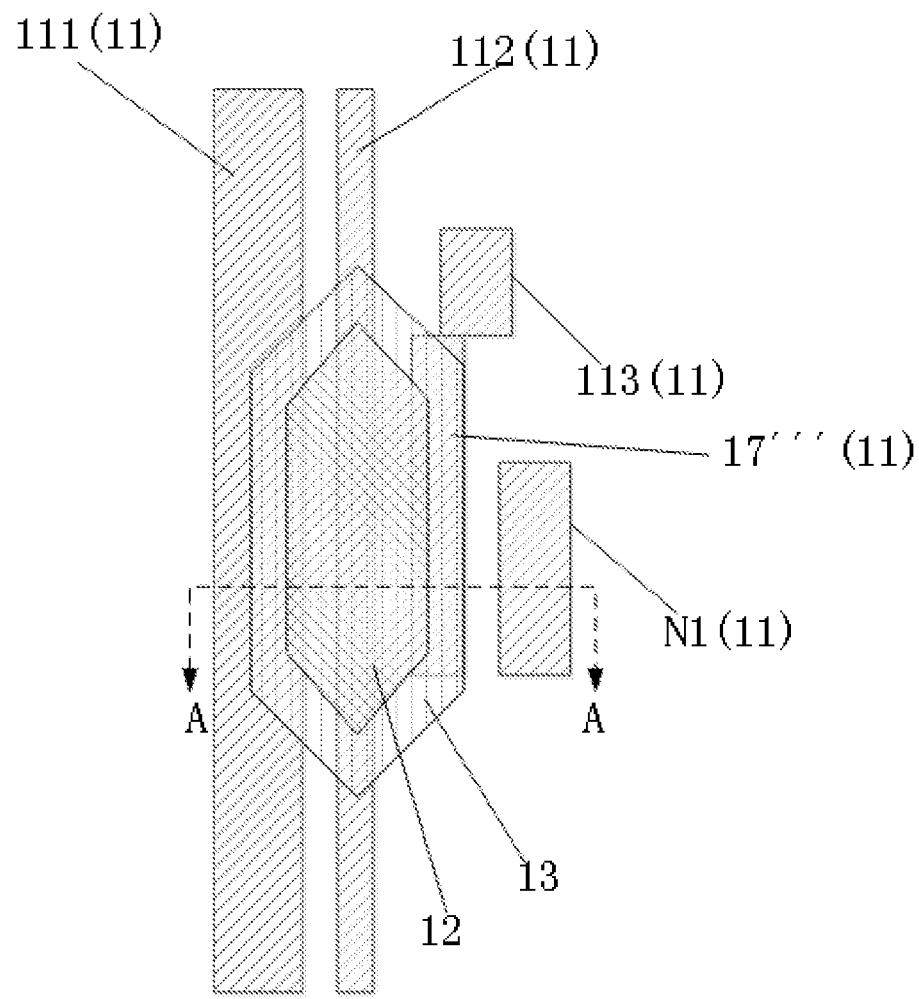
FIG. 11 is a schematic plan view of a red pixel region of an OLED display substrate according to some embodiments of the present disclosure.
Figure 12:
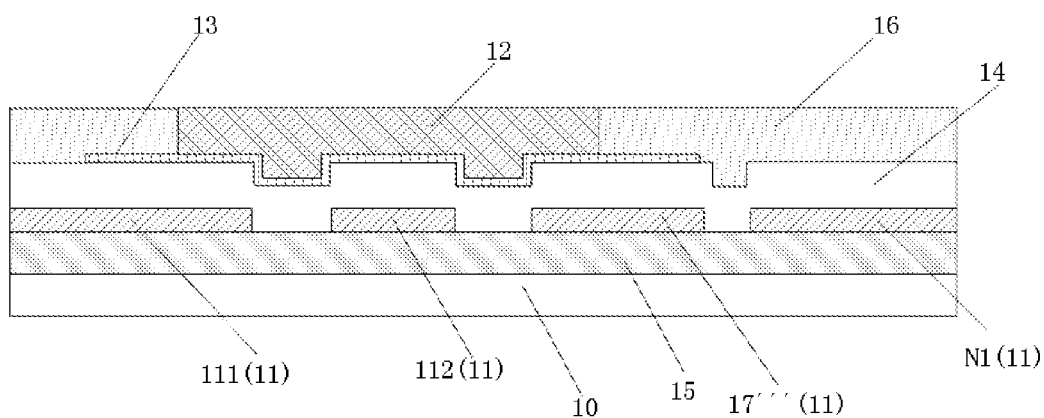
FIG. 12 is a schematic cross-sectional structural view of the red pixel region taken along line A-A in FIG. 11.

FIG. 11 illustrates a schematic plan view of a red pixel region of an OLED display substrate according to some embodiments of the present disclosure. FIG. 12 shows a schematic cross-sectional structure of the red pixel region taken along line A-A in FIG. 11. In the embodiments, the structure of the red pixel region of the OLED display substrate is substantially the same as the structure of the red pixel region of the OLED display substrate in the embodiments corresponding to FIG. 5 and FIG. 6. The following mainly introduces differences between the two structures.

As shown in FIGS. 11 and 12, the additional pad layer 17''' is electrically connected to the first signal terminal 113. For example, the additional pad layer 17''' is in direct electrical contact with the first signal terminal 113. Although the boundary between the additional pad layer 17''' and the first signal terminal 113 is shown in FIGS. 11 and 12, those skilled in the art may understand that the additional pad layer 17''' is integrated with the first signal terminal 113, and the additional pad layer 17''' may be considered to extend from the first signal terminal 113 toward the data line 112. In the embodiments, the orthographic projection of the additional pad layer 17''' on the base substrate 10 does not fall within an orthographic projection of the anode 13 on the base substrate 10, but is partly overlapped with the orthographic projection of the anode 13 on the base substrate 10. The process of the structure in which the additional pad layer 17''' is directly electrically connected to the first signal terminal 113 is simple, and the OLED display substrate with the structure is easy to manufacture. Since the additional pad layer 17''' is directly electrically connected to the first signal terminal 113, it is possible to prevent the additional pad layer 17''' from forming an island and accumulating electrostatic charges, thereby preventing adverse effects on the display substrate.

In other embodiments, the additional pad layer 17''' may also be electrically connected to the first signal terminal 113 through a connection electrode, and the connection electrode may be disposed in the same layer as the additional pad layer 17''' and the first signal terminal 113, or may be in a different layer from the additional pad layer 17''' and the first signal terminal 113.

The foregoing embodiments of the present disclosure are basically described for the red pixel region of the OLED display substrate. Those skilled in the art may understand that, for pixel regions with other colors, if there is a problem of chromatic aberration caused by a structure similar to the structure in the embodiments corresponding to FIG. 3 and FIG. 4, the problem may also be solved by using the solution in the foregoing embodiments.

Some embodiments of the present disclosure provide a display device. The display device may include the display substrate in the foregoing embodiments. The display device may be any product or component having a display function, such as a television, a monitor, a digital photo frame, a mobile phone, a smart watch, a tablet computer, and the like.

Figure 13:
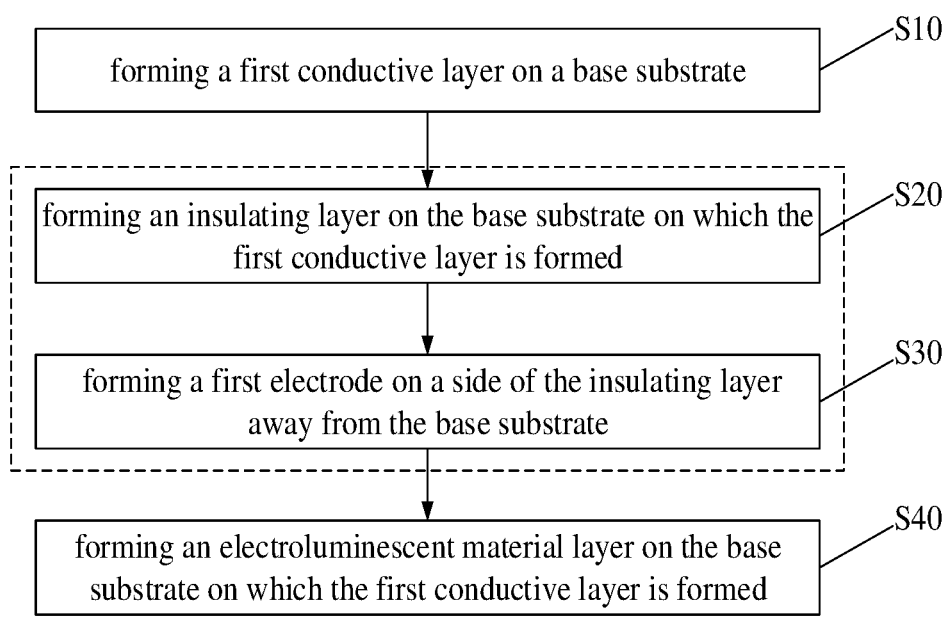
FIG. 13 is a flowchart of a method for manufacturing an OLED display substrate according to some embodiments of the present disclosure.

Some embodiments of the present disclosure provide a method for manufacturing a display substrate. FIG. 13 shows a flowchart of a method for manufacturing a display substrate according to some embodiments of the present disclosure. As shown in FIG. 13, the method for manufacturing the display substrate includes the following steps:

S10, forming a first conductive layer on a base substrate, wherein the first conductive layer includes a first signal line, a second signal line, and an additional pad layer which are spaced apart from each other.

S40, forming an electroluminescent material layer on the base substrate on which the first conductive layer is formed.

Specifically, in some embodiments, in step S10, a first conductive material layer may be deposited on the base substrate, and the first conductive material layer is patterned using a patterning process to form the first conductive layer including the first signal line, the second signal line and the additional pad layer which are spaced apart from each other.

Specifically, in some embodiments, in step S40, a pixel-defining material layer may coat the base substrate on which the first conductive layer is formed, and a partial region of the pixel-defining material layer is removed by a patterning process to form a pixel defining layer and a groove surrounded by the pixel defining layer, and an electroluminescent material fills the groove to form the electroluminescent material layer.

The structure of the red pixel region of the OLED display substrate shown in FIG. 5 may be formed based on the above method. In the above structure formed by the above method, the electroluminescent material layer includes a first end portion and a second end portion opposite to each other. An orthographic projection of the first end portion on the base substrate falls within an orthographic projection of the first signal line on the base substrate, and an orthographic projection of the second end portion on the base substrate falls within an orthographic projection of the additional pad layer on the base substrate. The orthographic projection of the first end portion on the base substrate and the orthographic projection of the second end portion on the base substrate are respectively located on both sides of an orthographic projection of the second signal line on the base substrate. By providing the additional pad layer disposed on the same layer as the first signal line, the additional pad layer raises a right edge region of a pixel, such as a red pixel, so that a left edge region and the right edge region of the red pixel are basically symmetrical in structure. In this case, the left edge region and the right edge region of the electroluminescent material layer of the red pixel have the same thickness and are basically located at the same height. As a result, light emission in the left edge region of the red pixel is basically the same as that in the right edge region of the red pixel, thereby reducing the chromatic aberration.

In some embodiments, before forming the electroluminescent material layer, as shown in FIG. 13, the method for manufacturing the display substrate further includes the following steps:

S20, forming an insulating layer on the base substrate on which the first conductive layer is formed;

S30, forming a first electrode on a side of the insulating layer away from the base substrate.

In step S20, the insulating layer may be formed by a deposition process, the insulating layer covers the first conductive layer including the first signal line, the second signal line, and the additional pad layer spaced apart from each other, and fills an interval between any adjacent ones of the first signal line, the second signal line and the additional pad layer.

In step S30, the first electrode may be formed by a patterning process, the first electrode is formed on a surface of the insulating layer away from the base substrate, and conform to a shape of the surface.

Some embodiments of the present disclosure provide a pixel driving circuit configured to drive a pixel in the display substrate described in the foregoing embodiments. The pixel driving circuit adopts the driving circuit shown in FIG. 2. As shown in FIG. 2, the pixel driving circuit includes a first transistor T1, a second transistor T2, a third transistor T3, a fourth transistor T4, a fifth transistor T5, a sixth transistor T6, a seventh transistor T7, and a capacitor Cst. The pixel includes an electroluminescent device, for example, an organic light emitting device.

Specifically, the gate electrode of the first transistor T1 is connected to the reset signal Reset, the source electrode of the first transistor T1 is connected to the initialization voltage Vinit, and the drain electrode of the first transistor T1 is connected to the first node N1. The gate electrode of the second transistor T2 is connected to the scanning signal Gate, the source electrode of the second transistor T2 is electrically connected to the second node N2, and the drain electrode of the second transistor T2 is electrically connected to the first node N1. The gate electrode of the third transistor T3 is electrically connected to the first node N1, the source electrode of the third transistor T3 is electrically connected to the third node N3, and the drain electrode of the third transistor T3 is electrically connected to the second node N2. The gate electrode of the fourth transistor T4 is connected to the scanning signal Gate, the source electrode of the fourth transistor T4 is connected to the data signal Data, and the drain electrode of the fourth transistor T4 is electrically connected to the third node N3. The gate electrode of the fifth transistor T5 is connected to the emission control signal EM, the source electrode of the fifth transistor T5 is connected to the ELVDD voltage, and the drain electrode of the fifth transistor T5 is electrically connected to the third node N3. The gate electrode of the sixth transistor T6 is connected to the emission control signal EM, the source electrode of the sixth transistor T6 is electrically connected to the second node N2, and the drain electrode of the sixth transistor T6 is electrically connected to the fourth node N4. The gate electrode of the seventh transistor T7 is connected to the scanning signal Gate, the source electrode of the seventh transistor T7 is connected to the initialization voltage Vinit, and the drain electrode of the seventh transistor T7 is electrically connected to the fourth node N4. The first capacitor plate Cst1 of the capacitor Cst is electrically connected to the first node N1, and the second capacitor plate Cst2 of the capacitor Cst is connected to the ELVDD voltage. The first electrode of the electroluminescent device is electrically connected to the fourth node, and the second electrode of the electroluminescent device is connected to the ELVSS voltage. As shown in FIGS. 7-12, the additional pad layer 17 may be electrically connected to the first node N1 or the initialization voltage Vinit.

Although the present disclosure has been described with reference to the accompanying drawings, the embodiments disclosed in the drawings are intended to exemplify the embodiments of the present disclosure, and should not be construed as a limitation to the present disclosure. The dimensional ratios in the drawings are only schematic and should not be construed as limiting the present disclosure.

The above embodiments only exemplarily illustrate the principle and structure of the present disclosure and are not intended to limit the present disclosure. Those skilled in the art should understand that any changes and improvements made to the present disclosure are within the scope of the disclosure without departing from the general concept of the disclosure. The protection scope of this disclosure shall be a scope defined by the claims of this application.

What is claimed is:

1. A display substrate comprising:
a base substrate;
a first conductive layer on the base substrate, the first conductive layer comprising a first signal line, a second signal line, and an additional pad layer which are spaced apart from each other; and
a first electrode on a side of the first conductive layer away from the base substrate,
wherein the first electrode comprises a first side portion and a second side portion opposite to each other, an orthographic projection of the first side portion on the base substrate and an orthographic projection of the first signal line on the base substrate have a first overlapping region, an orthographic projection of the second end portion on the base substrate and an orthographic projection of the additional pad layer on the base substrate have a second overlapping region, and the orthographic projection of the first side portion on the base substrate and the orthographic projection of the second side portion on the base substrate are respectively located on both sides of an orthographic projection of the second signal line on the base substrate, and
wherein the first conductive layer further comprises a first electrical connection portion, an orthographic projection of the first electrical connection portion on the base substrate does not overlap an orthographic projection of the second overlapping region on the base substrate.

2. The display substrate according to claim 1, wherein the additional pad layer is integrated with the first electrical connection portion.

3. The display substrate according to claim 1, wherein the additional pad layer is electrically connected to the first electrical connection portion through a connection electrode.

4. The display substrate according to claim 1, wherein the additional pad layer is spaced apart from the first electrical connection portion.

5. The display substrate according to claim 4, wherein the first conductive layer further comprises a first signal terminal, and an orthographic projection of the first signal terminal on the base substrate does not overlap an orthographic projection of the first electrode on the base substrate.

6. The display substrate according to claim 1, wherein the additional pad layer partially overlaps the first electrode.

7. The display substrate according to claim 1, wherein an area of the second overlapping region is greater than an area of a remaining region of the additional pad layer other than the second overlapping region.

8. The display substrate according to claim 1, wherein a length of the second overlapping region in an extending direction of the second signal line is greater than a length of a remaining region of the additional pad layer other than the second overlapping region in the extending direction of the second signal line.

9. The display substrate according to claim 1, wherein an orthographic projection of the first side portion on a first plane substantially coincides with an orthographic projection of the second side portion on the first plane, wherein the first plane is perpendicular to the base substrate and parallel to an extending direction of the second signal line.

10. The display substrate according to claim 9, wherein the first signal line, the second signal line, and the additional pad layer are parallel to each other, and a distance between the first signal line and the second signal line is substantially equal to a distance between the second signal line and the additional pad layer.

11. The display substrate according to claim 10, wherein the first electrode further comprises a first portion adjacent to the first side portion and a second portion adjacent to the second side portion, an orthographic projection of the first portion on the base substrate is located between the orthographic projection of the first signal line on the base substrate and the orthographic projection of the second signal line on the base substrate, and an orthographic projection of the second portion on the base substrate is located between the orthographic projection of the second signal line on the base substrate and the orthographic projection of the additional pad layer on the base substrate.

12. The display substrate according to claim 11, wherein an orthographic projection of the first portion on the first plane substantially coincides with an orthographic projection of the second portion on the first plane.

13. The display substrate according to claim 11, wherein a thickness of the first side portion is equal to a thickness of the second side portion, a thickness of the first portion is equal to a thickness of the second portion.

14. The display substrate according to claim 11, wherein the first electrode further comprises a third portion located between the first portion and the second portion, and an orthographic projection of the third portion on the base substrate overlaps the orthographic projection of the second signal line on the base substrate.

15. The display substrate according to claim 14, wherein the third portion, the first side portion, and the second side portion have the same thickness.

16. The display substrate according to claim 11, further comprising:
    an insulating layer on the side of the first conductive layer away from the base substrate, the insulating layer filling an interval between the first signal line and the second signal line and an interval between the second signal line and the additional pad layer; and
    an electroluminescent material layer disposed on a side of the first electrode away from the base substrate.

17. A pixel driving circuit, configured to drive a pixel in the display substrate according to claim 1, wherein the pixel driving circuit comprises a first transistor, a second transistor, a third transistor, a fourth transistor, a fifth transistor, a sixth transistor, a seventh transistor, and a capacitor, and the pixel comprises an electroluminescent device, wherein:
    a gate electrode of the first transistor is connected to a reset signal, a source electrode of the first transistor is connected to an initialization voltage, and a drain electrode of the first transistor is connected to a first node;
    a gate electrode of the second transistor is connected to a scanning signal, a source electrode of the second transistor is electrically connected to a second node, and a drain electrode of the second transistor is electrically connected to the first node;
    a gate electrode of the third transistor is electrically connected to the first node, a source electrode of the third transistor is electrically connected to a third node, and a drain electrode of the third transistor is electrically connected to the second node;
    a gate electrode of the fourth transistor is connected to the scanning signal, a source electrode of the fourth transistor is connected to a data signal, and a drain electrode of the fourth transistor is electrically connected to the third node;
    a gate electrode of the fifth transistor is connected to an emission control signal, a source electrode of the fifth transistor is connected to an ELVDD voltage, and a drain electrode of the fifth transistor is electrically connected to the third node;
    a gate electrode of the sixth transistor is connected to the emission control signal, a source electrode of the sixth transistor is electrically connected to the second node, and a drain electrode of the sixth transistor is electrically connected to a fourth node;
    a gate electrode of the seventh transistor is connected to the scanning signal, a source electrode of the seventh transistor is connected to the initialization voltage, and a drain electrode of the seventh transistor is electrically connected to the fourth node;
    a first capacitor plate of the capacitor is electrically connected to the first node, and a second capacitor plate of the capacitor is connected to the ELVDD voltage;
    a first electrode of the electroluminescent device is electrically connected to the fourth node, and a second electrode is connected to an ELVSS voltage, and
    the additional pad layer is electrically connected to the first node or the initialization voltage.

18. A display substrate comprising:
    a base substrate;
    a first conductive layer on the base substrate, the first conductive layer comprising a first signal line, a second signal line, and an additional pad layer which are spaced apart from each other; and
    a first electrode on a side of the first conductive layer away from the base substrate,
    wherein the first electrode comprises a first side portion and a second side portion opposite to each other, an orthographic projection of the first side portion on the base substrate and an orthographic projection of the first signal line on the base substrate have a first overlapping region, an orthographic projection of the second end portion on the base substrate and an orthographic projection of the additional pad layer on the base substrate have a second overlapping region, and the orthographic projection of the first side portion on the base substrate and the orthographic projection of the second side portion on the base substrate are respectively located on both sides of an orthographic projection of the second signal line on the base substrate,
    wherein the first conductive layer further comprises a first electrical connection portion, an orthographic projection of the first electrical connection portion on the base substrate does not overlap at least partially with an orthographic projection of the second overlapping region on the base substrate, and
    wherein the additional pad layer is integrated with the first electrical connection portion, and/or
    wherein the additional pad layer is electrically connected to the first electrical connection portion through a connection electrode.

* * * * *